United States Patent
Nam et al.

(10) Patent No.: US 10,277,214 B2
(45) Date of Patent: Apr. 30, 2019

(54) DIGITAL SIGNAL OUTPUT DEVICE (71) Applicant: DOOSAN HEAVY INDUSTRIES & CONSTRUCTION CO., LTD., Changwon-si, Gyeongsangnam-do (KR)

(72) Inventors: Junghan Nam, Yongin-si (KR); Minyeong Jang, Yongin-si (KR)

(73) Assignee: Doosan Heavy Industries Construction Co., Ltd, Gyeongsangnam-do (KR)

( * ) Notice: Subject to any disclaimer, the term of this patent is extended or adjusted under 35 U.S.C. 154(b) by 0 days.

(21) Appl. No.: 15/956,789

(22) Filed: Apr. 19, 2018

(65) Prior Publication Data
US 2018/0337664 A1   Nov. 22, 2018

(30) Foreign Application Priority Data
May 18, 2017 (KR) .................. 10-2017-0061701

(51) Int. Cl.
*H03K 5/1252* (2006.01)
*G05F 1/46* (2006.01)
*H03K 3/3565* (2006.01)

(52) U.S. Cl.
CPC ............ *H03K 5/1252* (2013.01); *G05F 1/46* (2013.01); *H03K 3/3565* (2013.01)

(58) Field of Classification Search
CPC ....... H03K 5/1252; H03K 5/3565; G05F 1/46
See application file for complete search history.

(56) References Cited

U.S. PATENT DOCUMENTS

| 4,558,226 A | * | 12/1985 | Takada | G01R 19/155 250/214 R |
| 4,745,610 A | * | 5/1988 | Yoshikawa | H01S 5/06825 372/33 |
| 4,926,068 A | * | 5/1990 | Fujita | H03K 3/02337 327/205 |

(Continued)

FOREIGN PATENT DOCUMENTS

| KR | 19930016114 A | 8/1993 |
| KR | 19980014902 U | 6/1998 |

(Continued)

OTHER PUBLICATIONS

A Notice of Allowance dated Jun. 18, 2018 in connection with Korean Patent Application No. 10-2017-0061701.

*Primary Examiner* — Thomas J. Hiltunen
(74) *Attorney, Agent, or Firm* — Invenstone Patent, LLC (57) ABSTRACT

A digital signal output device prevents a chattering phenomenon by utilizing hysteresis characteristics of two Zener diodes having different reference voltages. The device includes an input terminal for receiving an input voltage and an output terminal configured to output different digital signal values according to the on/off status of a first photocoupler. The device outputs a first digital signal value (e.g., "1") when the received input voltage increases to a voltage level greater than or equal to a first reference voltage, and to output a second digital signal value (e.g., "0") when the received input voltage having increased to the voltage level greater than or equal to the first reference voltage subsequently decreases to a voltage level less than a second reference voltage that is lover lower than the first reference voltage.

18 Claims, 5 Drawing Sheets

(56) References Cited

U.S. PATENT DOCUMENTS

| | | | | |
|---|---|---|---|---|
| 5,675,276 A | * | 10/1997 | Goel | H03K 3/2893 |
| | | | | 327/143 |
| 6,188,764 B1 | * | 2/2001 | Huang | H04M 3/18 |
| | | | | 379/373.01 |
| 6,407,605 B1 | * | 6/2002 | McCann | H03K 3/02337 |
| | | | | 327/205 |
| 7,741,828 B2 | * | 6/2010 | Wittman | G01R 19/16547 |
| | | | | 324/613 |
| 7,829,836 B2 | * | 11/2010 | Matsumoto | H03K 7/08 |
| | | | | 250/214 LS |
| 7,940,090 B2 | * | 5/2011 | Yoshida | H03K 17/13 |
| | | | | 327/79 |
| 9,641,171 B2 | * | 5/2017 | Jeep | H03K 17/30 |
| 9,673,791 B2 | * | 6/2017 | Wakasugi | H03K 3/2893 |
| 2016/0149514 A1 | * | 5/2016 | Faschang | H02M 7/537 |
| | | | | 363/131 |
| 2017/0269621 A1 | * | 9/2017 | Frucht | G01R 19/1658 |

FOREIGN PATENT DOCUMENTS

| | | |
|---|---|---|
| KR | 1019980030299 A | 7/1998 |
| KR | 20020019627 A | 3/2002 |
| KR | 100567133 B1 | 4/2006 |
| KR | 1020110030805 A | 3/2011 |
| KR | 1020110074202 A | 6/2011 |
| KR | 101070034 B1 | 10/2011 |
| KR | 20150105971 A | 9/2015 |
| KR | 1020170009127 A | 1/2017 |

* cited by examiner

[Fig.1]

Related Art

DIGITAL SIGNAL OUTPUT DEVICE

CROSS REFERENCE TO RELATED APPLICATIONS

The present application claims priority to Korean Patent Application No. 10-2017-0061701, filed May 18, 2017, the entire contents of which is incorporated herein for all purposes by this reference.

BACKGROUND OF THE INVENTION

Field of the Invention

The present invention relates generally to a digital signal output device and, more particularly, to a digital signal output device that can prevent a chattering phenomenon resulting from outputting different digital signal values according to the status of a photocoupler.

Description of the Related Art

A contemporary digital signal output device outputs a digital signal value of "1" when a voltage greater than or equal to a reference voltage is applied and outputs a digital signal value of "0" when a voltage lower than the reference voltage is applied. That is, the contemporary device outputs a digital signal based solely on the reference voltage, whereby an unintended digital signal may be generated. In particular, when an input voltage includes a noise component, an undesired digital output signal may result, and a chattering phenomenon may occur.

Therefore, there is a need to provide a digital signal output device that outputs a specific digital signal based on the input signal, even in a noisy electrical environment. In other words, it is necessary to realize a digital signal output device whose output is not affected by noise present in an input signal.

SUMMARY OF THE INVENTION

It is an object of the present invention to provide a digital signal output device in which hysteresis characteristics are effected, using two Zener diodes having different reference voltages, thereby outputting different digital signal values even in cases of the same input voltage levels being applied.

It is another object of the present invention to provide a digital signal output device that is not affected by noise present in an input signal, using two Zener diodes having different reference voltages and connecting the light receiving portion of a photocoupler to the Zener diode having a smaller reference voltage of the two Zener diodes.

It is another object of the present invention to provide a digital signal output device that outputs different digital signal values according to the on/off status of a first photocoupler, even in cases where the same input voltage level may be applied.

It is another object of the present invention to provide a digital signal output device in which a chattering phenomenon is prevented.

According to one aspect of the present invention, a digital signal output device may include an input terminal for receiving an input voltage; and an output terminal configured to output a first digital signal value when the received input voltage increases to a voltage level greater than or equal to a first reference voltage, and to output a second digital signal value when the received input voltage having increased to the voltage level greater than or equal to the first reference voltage subsequently decreases to a voltage level less than a second reference voltage that is lower than the first reference voltage.

The digital signal output device may further include a first Zener diode having a first node connected to the input terminal; a second Zener diode having a first node connected to the input terminal; a first resistor connected to the first Zener diode; and a second resistor connected to the second Zener diode. The first reference voltage is the reverse breakdown voltage of the first Zener diode, and the second reference voltage is the reverse breakdown voltage of the second Zener diode.

The digital signal output device may further include a first photocoupler including a first light receiving portion connected to the second Zener diode, and the first photocoupler may further include a first light emitting portion respectively connected on one side to a second node of the first Zener diode and to a second node of the second Zener diode.

The first light emitting portion may be connected to the first Zener diode via a first resistor and to the second Zener diode via the first light receiving portion and a second resistor.

The digital signal output device may further include a second photocoupler including: a second light emitting portion connected on one side to the first light emitting portion; and a second light receiving portion connected on one side to the output terminal.

According to another aspect of the present invention, a digital signal output device may include a first Zener diode having a first node connected to a input terminal for receiving an input voltage; a second Zener diode having a first node connected to the input terminal, the second Zener diode being connected in parallel with the first Zener diode; a first light receiving portion connected on one side to a second node of the second Zener diode; and a first light emitting portion connected in parallel to a second node of the first Zener diode and to the other side of the first light receiving portion.

The first light receiving portion and the first light emitting portion may constitute a first photocoupler.

The reverse breakdown voltage of the first Zener diode may be used as a first reference voltage, and the reverse breakdown voltage of the second Zener diode may be used as a second reference voltage. The first reference voltage may be higher than the second reference voltage.

The digital signal output device may further include a second light emitting portion having an anode connected in series with a cathode of the first light emitting portion; and a second light receiving portion receiving light emitted by the second light emitting portion, the second light receiving portion being connected in series between a source voltage and an output resistor. The second light emitting portion and the second light receiving portion may constitute a second photocoupler.

The digital signal output device may further include an output terminal configured to output a first digital signal value when the first photocoupler is in an "off" state and the input voltage increases to a voltage level greater than or equal to the first reference voltage; to output a second digital signal value when the first photocoupler is in an "off" state and the input voltage is less than the first reference voltage; to output a first digital signal value when the first photocoupler is in an "on" state and the input voltage is greater than or equal to the second reference voltage; and to output a second digital signal value when the first photocoupler is in an "on" state and the input voltage is less than the second reference voltage.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

The foregoing and additional aspects are embodied through the embodiments described with reference to the accompanying drawings. It is to be understood that the components of each embodiment are capable of various combinations within the embodiments as long as they are not mutually exclusive or mutually contradictory.

In order to clearly illustrate the invention proposed in the drawings, parts not related to the description are omitted, and like parts are denoted by similar reference numerals throughout the specification. Also, throughout this specification, when a part is referred to as being "connected" with another part, it includes not only being "directly connected," but also being "electrically connected" by interposing another part therebetween. Further, throughout this specification, a signal means an electric quantity such as a voltage or a current.

Figure 1:
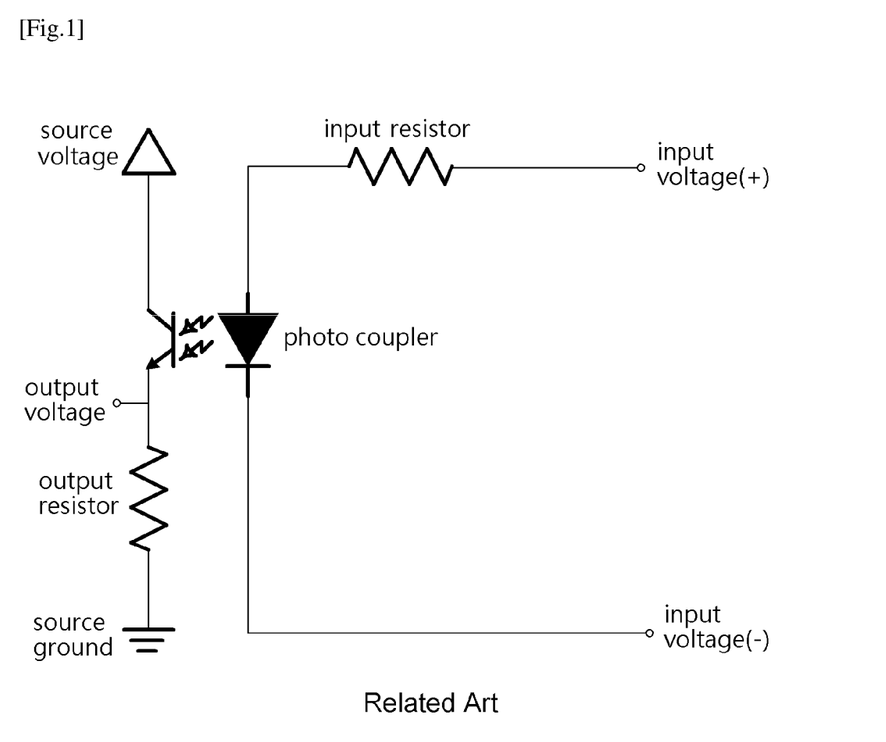
FIG. 1 is a schematic circuit diagram of a digital signal output device according to a related art.

FIG. 1 shows a digital signal output device according to a related art, which includes a pair of terminals (+, −) for receiving an applied input voltage, an input resistor connected at one end to the positive terminal, and a photocoupler connected to the other end of the input resistor. Here, the photocoupler is a contemporary photocoupler and may include a light emitting portion to which the input resistor is connected and a light receiving portion connected between a source voltage and an output resistor.

According to a contemporary art, current flows in the light emitting portion of the photocoupler when a voltage greater than or equal to a reference voltage is applied to the light emitting portion, that is, when the photocoupler's threshold voltage is reached. When current flows through the light emitting portion, it emits an output electrical signal in the form of light, which is received by the light receiving portion as an input electrical signal. The light receiving unit may be configured as a combination of a light receiving element and a transistor (e.g., a BJT, FET, or the like), by which the transistor is turned on when an input electrical signal is received by the light receiving element and is turned off when no input electrical signal is received. Thus, the light receiving unit functions as an on/off power switch for controlling the voltage source current flowing to the output resistor, which is connected to an output voltage terminal, and the light-emitting unit functions as a power switch control unit for controlling the on/off power switch.

Figure 2:
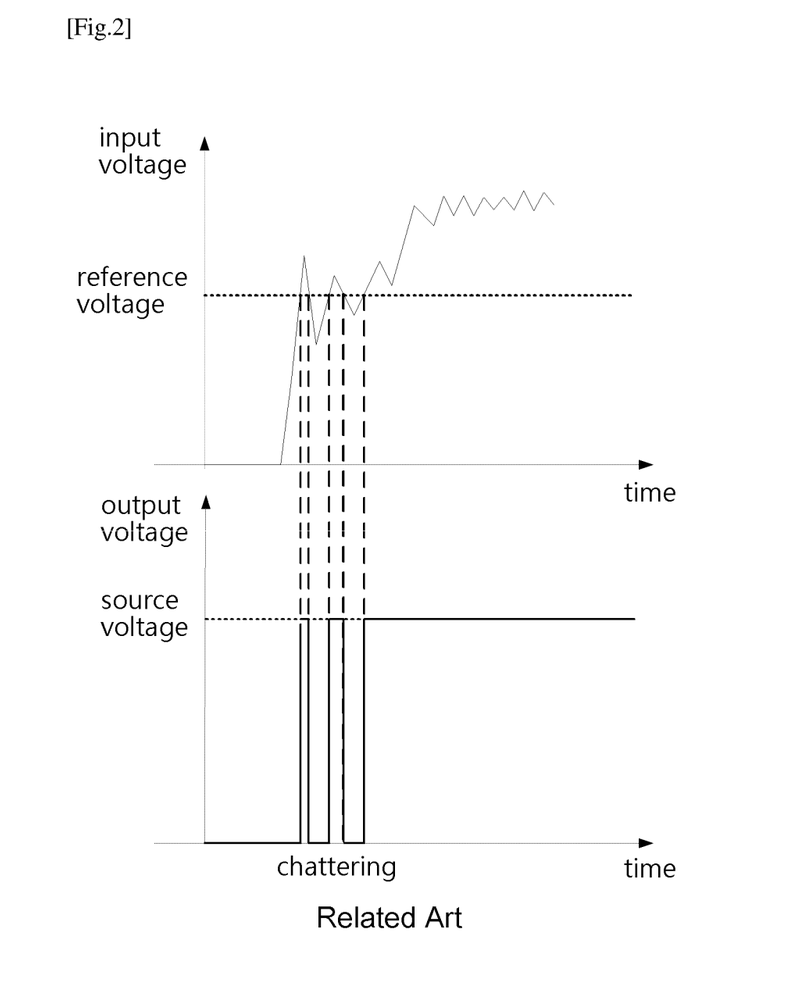
FIG. 2 is a pair of graphs respectively showing the input and output voltages of the digital signal output device of FIG. 1.

Referring to FIG. 2, whenever the input voltage applied to the digital signal output device of FIG. 1 is greater than or equal to the reference voltage (photocoupler threshold voltage), the device outputs the source voltage as the equivalent of a digital value of "1," which is developed across the output resistor. Whenever the applied input voltage is less than the reference voltage, the device of FIG. 1 outputs a source voltage value of zero volts, i.e., a digital value of "0," since the voltage at the output voltage terminal is pulled to ground through the output resistor.

Conventionally, when noise is present in an input voltage applied to a digital signal output device, the value of the input voltage tends to cross a photocoupler's threshold erratically, by repeatedly dropping below the reference value and then rising again. That is, as shown in FIG. 2, the applied input voltage may, within a relatively short time span of transitioning from a low voltage to a high voltage, exhibit multiple instances of being less than or greater than the reference voltage of the photocoupler. During this time, the applied input voltage will even be equal to the reference voltage repeatedly. As a result, the digital output signal is distorted due to a chattering phenomenon. To assure the output of a stable digital signal, it is necessary to prevent the chattering phenomenon due to noise in the applied input signal.

Figure 3:
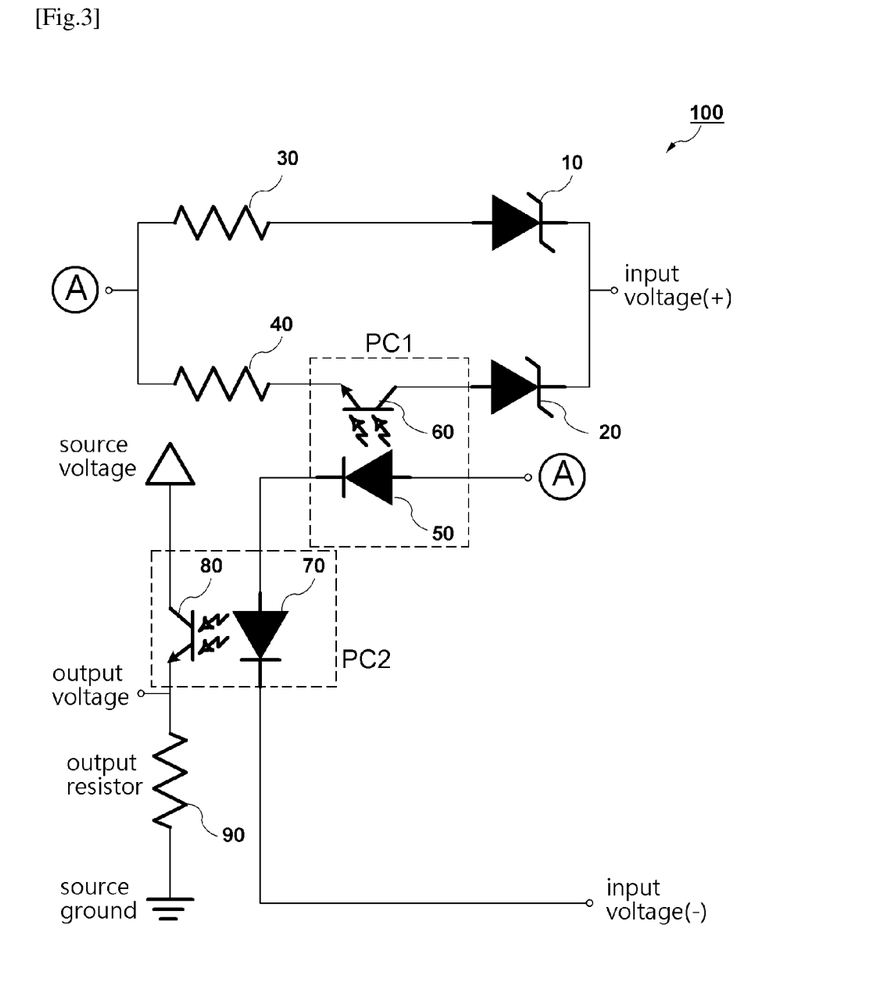
FIG. 3 is a schematic diagram of a digital signal output device according to the present invention.
Figure 4:
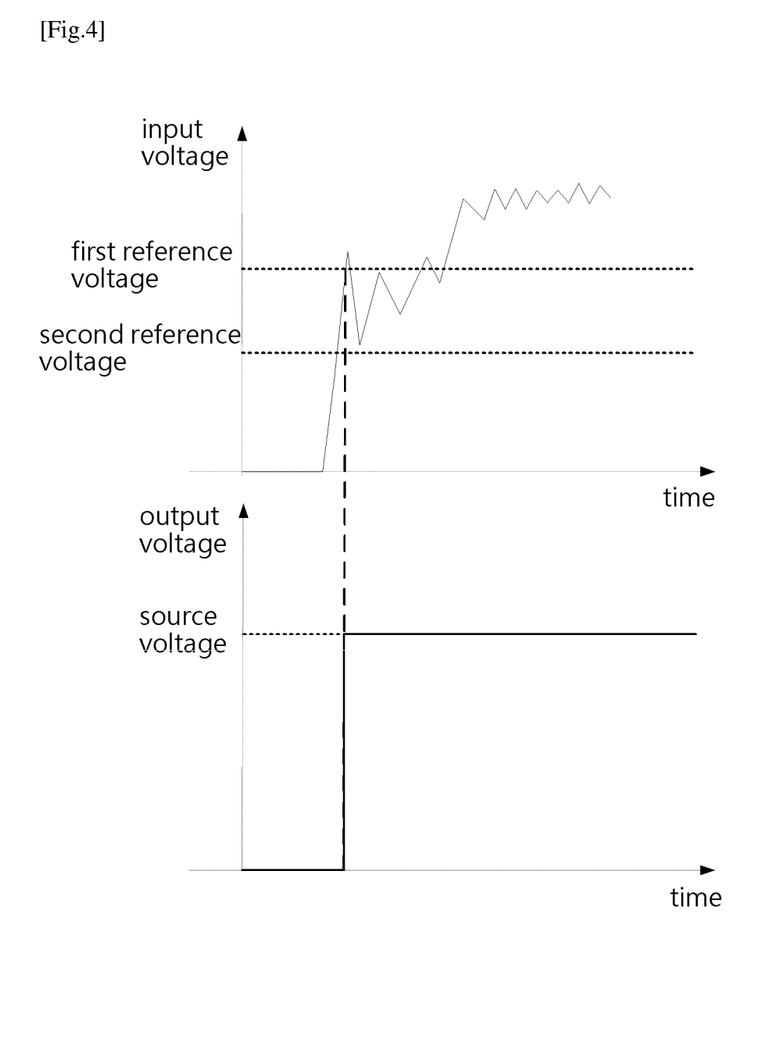
FIG. 4 is a pair of graphs respectively showing the input and output voltages of the digital signal output device of FIG. 3.

FIG. 3 shows a digital signal output device 100 according to the present invention, and FIG. 4 shows the input and output voltages of the device of FIG. 3. The digital signal output is a voltage based on the source voltage of FIG. 3 and may be substantially equal to the source voltage (e.g., a digital value of "1") or substantially equal to zero volts (e.g., a digital value of "0").

The digital signal output device 100 outputs a digital signal of a first digital value when the input voltage reaches a first reference voltage, i.e., transitions from a level below the first reference voltage to a level of at least the first reference voltage, such that the input voltage is greater than or equal to the first reference voltage. The digital signal output device 100 outputs a digital signal of a second digital value when an input voltage that has reached the first reference voltage subsequently decreases to a level that is below a second reference voltage, such that the input voltage is less than the second reference voltage. Here, the first digital value may be a digital value of "1," and the second digital value may be a digital value of "0."

Accordingly, the digital signal output device 100 outputs the first digital signal value when an input voltage that was greater than or equal to the first reference voltage decreases and drops below the first reference voltage but is still greater than or equal to the second reference voltage. The digital signal output device 100 outputs the second digital signal value when the above input voltage decreases further and drops below the second reference voltage.

The first reference voltage is the reference voltage of a first Zener diode 10, and the second reference voltage is the reference voltage of a second Zener diode 20. In the present embodiment, the first reference voltage is higher than the second reference voltage. Here, the reference voltages of the first and second Zener diodes 10 and 20 may correspond to their respective reverse breakdown voltages. The hysteresis effect attained by the two differing reference voltages will be described later.

Zener diodes exhibit the characteristics of a normal diode in the forward direction. On the other hand, when a voltage is applied across a Zener diode in the reverse direction, the Zener diode allows reverse current to flow at a specific voltage, which, typically, is substantially lower than the reverse breakdown voltage of a normal diode. Normal diodes are used for rectification and detection because very little current flows even when a high voltage is applied in the reverse direction. However, by adding a large amount of impurities to the PN junction of a normal diode, a Zener diode is produced, so if the applied voltage exceeds the reference voltage (called Zener voltage or reverse breakdown voltage), current flows rapidly in the reverse direction.

In the circuit of FIG. 3, an input voltage is applied to the digital signal output device 100 across positive and negative input terminals, or opposite polarity terminals. Although the input terminals of the present embodiment are described in terms of positive and negative polarity, the terminals of the digital signal output device 100 according to the present invention may be terminals of a first and second polarity, respectively, or terminals of a first and second voltage, respectively.

Referring to FIG. 3, the cathodes of the first and second Zener diodes 10 and 20 are each connected to the positive terminal to receive the applied input voltage, which is an input signal indicative of a digital value.

The digital signal output device 100 includes first and second photocouplers PC1 and PC2. The first and second photocouplers of the digital signal output device 100 may each be contemporary photocouplers such as that of the digital signal output device shown in FIG. 1. Here, the first photocoupler PC1 includes a first light emitting portion 50 and a first light receiving portion 60, and the second photocoupler PC2 includes a second light emitting portion 70 and a second light receiving portion 80.

The first light receiving portion 60 of the first photocoupler PC1 is connected on one side to the second Zener diode 20 and may be connected to the cathode or anode of the second Zener diode 20. In the present embodiment, the first light receiving portion 60 is connected to the anode of the second Zener diode 20.

In the schematic circuit diagram of FIG. 3, "A" nodes are connected to each other. Thus, the first light emitting portion 50 of the first photocoupler PC1 is respectively connected, via first and second resistors 30 and 40, to the anode side of each of the first and second Zener diodes 10 and 20. That is, the anode of the first Zener diode 10 is connected to the first light emitting portion 50 via the first resistor 30, and the anode of the second Zener diode 20 is connected to the first light emitting portion 50 via the first light receiving portion 60 and a second resistor 40. Thus, the digital signal output device 100 includes the first resistor 30 connected at one end to the anode of the first Zener diode 10; and the second resistor 40 connected at one end to the anode of the second Zener diode 20.

The second light emitting portion 70 of the second photocoupler PC2 is connected between the first light emitting portion 50 of the first photocoupler PC1 and the negative input terminal of the digital signal output device 100. The second light receiving portion 80 is connected on one side to an output resistor 90 and on the other side to a source voltage of the digital signal output device 100.

The digital signal output device 100 may output a digital signal value of "0" when the applied input voltage is less than the second reference voltage. The input voltage being less than the second reference voltage inherently means that the input voltage is less than the first reference voltage. Therefore, in the digital signal output device 100, no current may flow in either the first or second Zener diode 10 or 20 when the input voltage is less than the second reference voltage, whereby an off state is maintained for the first and second photocouplers PC1 and PC2. That is, while the input voltage is below the second reference voltage, such that both photocouplers are turned off, no current flows through the Zener diodes.

Meanwhile, the digital signal output device 100 may output a digital signal value of "0" when the first photocoupler PC1 is in an "off" state and the input voltage is greater than or equal to the second reference voltage and is less than the first reference voltage. In detail, although reverse current could flow through the second Zener diode 20 if the input voltage increases and becomes greater than or equal to the second reference voltage, that is, if the reverse breakdown voltage of the second Zener diode 20 is reached, current cannot flow through the first light receiving portion 60 connected to the second Zener diode 20 because the first photocoupler PC1 is off. As a result, no current may flow through the second Zener diode 20.

Also, since the input voltage is less than the first reference voltage, no current may flow through the first Zener diode 10.

The digital signal output device 100 may output a digital signal value of "1" when the input voltage is greater than or equal to the first reference voltage. In detail, if the input voltage is greater than or equal to the first reference voltage, that is, if the reverse breakdown voltage of the first Zener diode 10 is reached, reverse current may flow through the first Zener diode 10. The current flows through the first Zener diode 10, the first resistor 30, the first light emitting portion 50 of the first photocoupler PC1, and the second light emitting portion 70 of the second photocoupler PC2.

As the current flows through the first Zener diode 10, the first and second photocouplers PC1 and PC2 are both turned on. Since the first photocoupler PC1 is turned on, current may flow through the first light receiving portion 60 connected to the second Zener diode 20. Since the input voltage is greater than or equal to the second reference voltage, current flows through the second Zener diode 20 and the first light receiving portion 60. Since the second photocoupler PC2 is turned on, current flows through the second light receiving portion 80, and as a result, the source voltage is provided as the digital signal output. Here, the source voltage may correspond to a digital signal value of "1."

The digital signal output device 100 may output a digital signal value of "1" when the first photocoupler PC1 is in an "on" state and the input voltage is greater than or equal to the second reference voltage and is less than the first reference voltage. That the first photocoupler PC1 has already been turned on means there was a point in time when the input voltage was greater than or equal to the first reference voltage. In other words, when the input voltage is greater than or equal to the first reference voltage and thereafter drops below the first reference voltage but is still greater than or equal to the second reference voltage, the digital signal output device 100 outputs a digital signal value of "1."

If the input voltage is less than the first reference voltage, no current may flow through the first Zener diode 10. Meanwhile, current may flow through the second Zener diode 20 because the input voltage is greater than or equal to the second reference voltage. In this instance, since the first photocoupler PC1 has already been turned on, current may flow through the second Zener diode 20, the first light receiving portion 60, the second resistor 40, the first light emitting portion 50, and the second light emitting portion 70. As a result, current also flows through the second light receiving portion 80, thereby outputting the digital signal value of "1." Conversely, if the first photocoupler PC1 is turned off in the above case, that is, while the input voltage is greater than or equal to the second reference voltage and less than the first reference voltage, the digital signal output device 100 outputs a digital signal value of "0."

The digital signal output device 100 according to the present invention outputs different digital signal values according to the on/off status of the first photocoupler PC1, even in separate cases where an input voltage level may be the same. Moreover, as shown in FIG. 4, the same source voltage may be output for separates cases, for example, when the input voltage is greater than or equal to the first reference voltage and when the input voltage is less than the first reference voltage but higher than the second reference voltage.

That is, it may be confirmed that the chattering phenomenon is eliminated in FIG. 4 as compared with FIG. 2. In an embodiment of the present invention, the first reference voltage is 14-15V and the second reference voltage is 9-10V, which reference voltages are preferred for the prevention of the chattering phenomenon.

Figure 5:
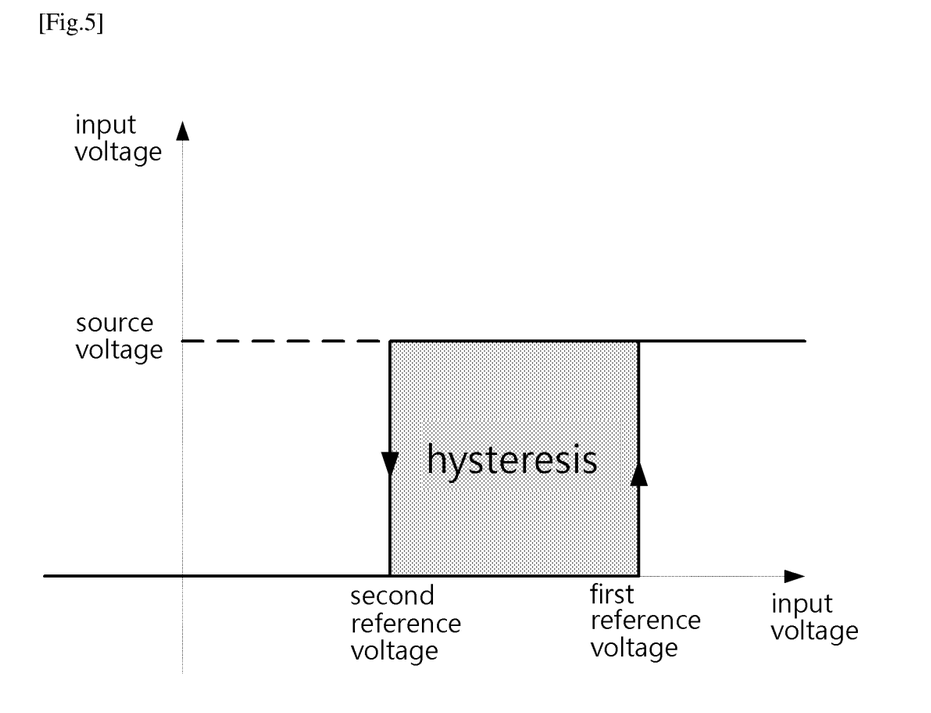
FIG. 5 is a graphical representation of the hysteresis obtained by a digital signal output device according to the present invention.

FIG. 5 shows hysteresis characteristics according to the present invention.

A hysteresis band shown in FIG. 5 is formed by threshold voltages each having different levels, which are determined by two Zener diodes. That is, the hysteresis band is formed by the first reference voltage of the first Zener diode 10 and the second reference voltage of the second Zener diode 20, as described above. The shape of the hysteresis band may be varied according to the threshold voltages of the Zener diodes, whereby it is possible implement the hysteresis characteristic intended by a user. In addition, the hysteresis band may be changed by changing the Zener diodes according to a range of input voltage levels of a digital signal output device 100.

The digital signal output device 100 with hysteresis characteristics may be unaffected by the noise of the input signal. As a result, a chattering phenomenon may be prevented, and may be prevented without a separate circuit for removing the chattering phenomenon.

As described above, the present invention implements a hysteresis effect using two Zener diodes having different reference voltages, thereby outputting different digital signal values even in cases of the same input voltage levels being applied. In addition, the present invention provides a digital signal output device that is not affected by noise of the input signal, using two Zener diodes having different reference voltages and connecting the light receiving portion of a photocoupler to the Zener diode having a smaller reference voltage of the two Zener diodes. In addition, the present invention provides a digital signal output device that generates different digital output signals according to the on/off status of the first photocoupler, even in cases where the same input voltage level may be applied.

The digital signal output device according to the present invention may be used in the fields of shipping, marine technology, chemicals, and steel, among others, but is not limited thereto. The digital signal output device according to the present invention may be applied to any field sensitive to electrical noise, particularly when the noise is present in an input signal from a power source operating in such an environment.

Those skilled in the art will recognize that the present invention can be embodied in other specific embodiments without departing from the spirit or essential characteristics thereof. It is therefore to be understood that the above-described embodiments are illustrative only and not restrictive of the scope of the invention as defined by the appended claims.

What is claimed is:

1. A digital signal output device comprising:
an input terminal for receiving an input voltage;
an output terminal configured to output a first digital signal value when the received input voltage increases to a voltage level greater than or equal to a first reference voltage, and to output a second digital signal value when the received input voltage having increased to the voltage level greater than or equal to the first reference voltage subsequently decreases to a voltage level less than a second reference voltage that is lower than the first reference voltage;
a first Zener diode having a first node connected to the input terminal and having a reverse breakdown voltage equal to the first reference voltage; and
a second Zener diode having a first node connected to the input terminal and having a reverse breakdown voltage equal to the second reference voltage.

2. The digital signal output device of claim 1, further comprising:
a first photocoupler including a first light receiving portion connected to the second Zener diode.

3. The digital signal output device of claim 2, wherein the first photocoupler further includes a first light emitting portion respectively connected on one side to a second node of the first Zener diode and to a second node of the second Zener diode.

4. The digital signal output device of claim 3, wherein the first light emitting portion is connected to the first Zener diode via a first resistor and to the second Zener diode via the first light receiving portion and a second resistor.

5. The digital signal output device of claim 3, further comprising:
a second photocoupler including:
a second light emitting portion connected on one side to the first light emitting portion; and
a second light receiving portion connected on one side to the output terminal.

6. The digital signal output device of claim 5, wherein the output terminal is further configured to output a second digital signal value when the first photocoupler is in an "off" state and the input voltage is greater than or equal to the second reference voltage and is less than the first reference voltage.

7. The digital signal output device of claim 5, wherein the output terminal is further configured to output the first digital signal value when the second photocoupler is in an "on" state and the input voltage is greater than or equal to the first reference voltage.

8. The digital signal output device of claim 3, wherein the output terminal is further configured to output the first digital signal value when the first photocoupler is in an "on" state and when the input voltage is greater than or equal to the second reference voltage and is less than the first reference voltage.

9. The digital signal output device of claim 1, further comprising:

a first resistor connected to the first Zener diode; and
a second resistor connected to the second Zener diode.

10. A digital signal output device comprising:
- a first Zener diode having a first node connected to an input terminal for receiving an input voltage;
- a second Zener diode having a first node connected to the input terminal, the second Zener diode being connected in parallel with the first Zener diode;
- a first light receiving portion connected on one side to a second node of the second Zener diode; and
- a first light emitting portion connected in parallel to a second node of the first Zener diode and to the other side of the first light receiving portion opposite to the one side of the first light receiving portion.

11. The digital signal output device of claim 10, wherein the first light receiving portion and the first light emitting portion constitute a first photocoupler.

12. The digital signal output device of claim 11, wherein the reverse breakdown voltage of the first Zener diode is a first reference voltage, and the reverse breakdown voltage of the second Zener diode is a second reference voltage, and
wherein the first reference voltage is higher than the second reference voltage.

13. The digital signal output device of claim 12, further comprising:
an output terminal configured to output a first digital signal value when the first photocoupler is in an "off" state and the input voltage increases to a voltage level greater than or equal to the first reference voltage.

14. The digital signal output device of claim 12, further comprising:
an output terminal configured to output a second digital signal value when the first photocoupler is in an "off" state and the input voltage is less than the first reference voltage.

15. The digital signal output device of claim 12, further comprising:
an output terminal configured to output a first digital signal value when the first photocoupler is in an "on" state and the input voltage is greater than or equal to the second reference voltage.

16. The digital signal output device of claim 12, further comprising:
an output terminal configured to output a second digital signal value when the first photocoupler is in an "on" state and the input voltage is less than the second reference voltage.

17. The digital signal output device of claim 10, further comprising:
- a second light emitting portion having an anode connected in series with a cathode of the first light emitting portion; and
- a second light receiving portion receiving light emitted by the second light emitting portion, the second light receiving portion being connected in series between a source voltage and an output resistor.

18. The digital signal output device of claim 17, wherein the second light emitting portion and the second light receiving portion constitute a second photocoupler.

* * * * *